United States Patent
Call et al.

[11] Patent Number: 5,930,597
[45] Date of Patent: Jul. 27, 1999

[54] REWORKABLE POLYMER CHIP ENCAPSULANT

[75] Inventors: Anson Jay Call, Holmes; Stephen Leslie Buchwalter, Hopewell Junction; Sushumna Iruvanti, Wappingers Falls; Stanley J. Jasne, Yorktown; Frank L. Pompeo, Jr., Walden; Paul Anthony Zucco, Red Hook; Wayne Martin Moreau, Wappingers Falls, all of N.Y.

[73] Assignee: International Business Machines Corporation, Armonk, N.Y.

[21] Appl. No.: 08/838,111

[22] Filed: Apr. 15, 1997

Related U.S. Application Data

[62] Division of application No. 08/477,062, Jun. 7, 1995, Pat. No. 5,659,203.

[51] Int. Cl.⁶ ........................... H01L 21/44; H01L 21/48; H01L 21/50
[52] U.S. Cl. ............................................. 438/106; 438/127
[58] Field of Search ..................................... 438/127, 106

[56] References Cited

U.S. PATENT DOCUMENTS

| | | |
|---|---|---|
| 4,323,914 | 4/1982 | Berndlmaier . |
| 4,632,798 | 12/1986 | Eickman et al. . |
| 4,636,578 | 1/1987 | Feinberg . |
| 4,736,012 | 4/1988 | Shoji et al. . |
| 4,750,092 | 6/1988 | Werther . |
| 4,758,875 | 7/1988 | Fujisaki et al. . |
| 4,951,122 | 8/1990 | Tsubosaki et al. . |
| 5,040,047 | 8/1991 | Cole et al . |
| 5,057,903 | 10/1991 | Olla . |
| 5,116,939 | 5/1992 | Fletcher et al. . |
| 5,191,404 | 3/1993 | Wu et al. . |
| 5,203,076 | 4/1993 | Banerji et al. . |
| 5,225,499 | 7/1993 | Kokaku et al. . |
| 5,239,200 | 8/1993 | Messina et al. . |
| 5,272,248 | 12/1993 | Pratt et al. . |
| 5,300,808 | 4/1994 | Suppelsa et al. . |
| 5,309,321 | 5/1994 | Olla et al. . |
| 5,344,795 | 9/1994 | Hashemi et al. . |
| 5,523,628 | 6/1996 | Williams et al. . |

OTHER PUBLICATIONS

IBM Technical Disclosure Bulletin, vol. 20, No. 10, Mar. 1978, "Semiconductor Encapsulation", Magdo.
IBM Technical Disclosure Bulletin, vol. 30, No. 3, Aug. 1987, "Surface Solder Package".
"Microelectronics Packaging Handbook", 1989, Tummala et al.

Primary Examiner—John F. Niebling
Assistant Examiner—Josetta I. Jones
Attorney, Agent, or Firm—DeLio & Peterson, LLC; John J. Tomaszewski; Steven J. Soucar

[57] ABSTRACT

A C4 or flip chip reworkable electronic device is provided comprising an integrated circuit chip having conductive pads thereon which pads are electrically connected to corresponding pads on an interconnection substrate by solder connections, wherein the space between the chip and substrate is sealed using a specially defined thermoplastic resin such as polysulfone and polyetherimide.

6 Claims, 2 Drawing Sheets

REWORKABLE POLYMER CHIP ENCAPSULANT

This is a divisional of application(s) Ser. No. 08/477,062 filed on Jun. 7, 1995 now U.S. Pat. No. 5,659,203

BACKGROUND OF THE INVENTION

1. Field of the Invention

The present invention relates to electronic devices, and in particular, to reworkable C4 encapsulated integrated circuit chips and their method of manufacture.

2. Description of Related Art

Electronic components utilizing integrated circuit chips are used in a number of applications. Controlled Collapse Chip Connection is an interconnect technology developed by IBM as an alternative to wire bonding. This technology is generally known as C4 technology or flip chip packaging. Broadly stated, one or more integrated circuit chips are mounted above a single or multiple layer substrate and pads on the chip are electrically connected to corresponding pads on the substrate by a plurality of electrical connections such as solder bumps The integrated circuit chips may be assembled in an array such as a 10×10 array. The substrate is then electrically connected to another electronic device such as a circuit board with the total package being used in an electronic device such as a computer. An array of integrated circuit chips and an apparatus for cooling the integrated circuit chips is shown in U.S. Pat. No. 5,239,200 which patent is hereby incorporated by reference.

Flip chip packaging is described in U.S. Pat. No. 5,191,404 which patent is hereby incorporated by reference. In general, flip chip joining is desirable for many applications because the footprint or area required to bond the chip to the substrate is equal to the area of the chip itself. Flip chip joining also exploits the use of a relatively small solder bump which typically measures a height of approximately 1 mil to 1.5 mils and a width of approximately 2 to 4 mils to join the pad on the chip to a corresponding pad on the substrate. Electrical and mechanical interconnects are formed simultaneously by reflowing the bumps at an elevated temperature. The C4 joining process is self-aligning in that the wetting action of the solder will align the chip's bump pattern to the corresponding substrate pads. This action compensates for chip to substrate misalignment up to several mils incurred during chip placement. In "Microelectronics Packaging Handbook" edited by R. R. Tummala and E. J. Rymaszewski, 1989, Van Nostrand Reinhold, pages 361–391, C4 chip to package interconnections are discussed and this reference is hereby incorporated by reference.

In the finished flip chip package there is an opening or space between the pad containing surface of the integrated circuit chip and the pad containing surface of the substrate resulting from the thickness of the solder bump connection between the pads. This open space can not be tolerated because any interference with the solder connections will adversely affect the performance of the package. For example, moisture, the infusion of thermal paste used to increase heat transfer from the chip and the mechanical integrity of the chip possibly breaking the electrical connections are all serious problems. To solve this problem integrated circuit chips are encapsulated in a suitable plastic package to protect the integrated circuit chip mechanically, electrically and chemically. In the C4 technology the chip opening is encapsulated totally or in many cases a sealant is used around the chip edges to seal the opening. Presently, non-reworkable sealants which are thermoset highly cross linked materials are used. These materials are insoluble and do not liquefy on heating and are generally applied in a low viscosity, unpolymerized form without any solvent and are polymerized in place. Epoxies are generally used and while useful for many applications generally restrict the use of C4 joining to single chip modules because they cannot be easily reworked and the complete module is replaced when it malfunctions. Other encapsulation materials have been developed but these are expensive and require expensive solvents to remove the encapsulant from the substrate.

The encapsulation of integrated circuit chips to improve their reliability is well known and a number of patents have issued in this area. Most of the patents, however, show the use of chips wire bonded or tap bonded and the chip is completely encapsulated in a transfer molded thermoset or thermoplastic polymer. Basically, this process involves melting the polymer in a cavity within the mold. A plunger then rams the molten polymer through an orifice into the mold ventricle. The integrated circuit chip and substrate are bonded to each other using a polymeric adhesive and the package is placed in the mold and the molten polymer forces in and around the package to totally encapsulate the device. A number of patents have issued in this area including: U.S. Pat. No. 4,632,798; 4,736,012; 4,750,092; 4,758,875; 4,952,122; 5,040,047; 5,057,903; 5,191,404; 5,225,499; 5,300,808; 5,309,321; and 5,344,795. The disclosures of the above patents are hereby incorporated by reference. Flip chip bonding offers many advantages in electronics manufacture compared to the complete encapsulation techniques above. One of the most important being the ability to remove and replace the chip without scrapping the chip or substrate. This removal and replacement termed rework can be performed numerous times without degrading quality or reliability.

Encapsulation of the flip chip packages however presents many problems. The flip chip package must be reliable and thermal mismatches between the encapsulant and the chip, substrate or solder bumps must be minimized to avoid stressing and damaging of the package. The encapsulant must be able to withstand the solder joining process temperatures. And further, the C4 encapsulated chip should also be reworkable to facilitate its usefulness.

Bearing in mind the problems and deficiencies of the prior art, it is therefore an object of the present invention to provide an integrated circuit chip containing electronic package wherein pads on the chip are electrically connected to pads on a substrate by solder connections wherein the solder area is effectively sealed (encapsulated ) to provide mechanical, electrical and chemical reliability and which chip is capable of being reworked in the event of a malfunction of the package.

It is another object of the present invention to provide a method for making a reworkable integrated circuit chip containing package having enhanced electrical, mechanical and chemical reliability properties wherein pads on the chip are electrically connected to pads on an interconnection substrate by electronic solder connections.

Still other objects and advantages of the invention will in part be obvious and will in part be apparent from the specification.

SUMMARY OF THE INVENTION

In one aspect of the invention a reworkable electronic device having enhanced mechanical, electrical and chemical reliability comprises an integrated circuit chip having conductive pads thereon which pads are electrically connected to corresponding conducting pads on an interconnection substrate by solder connections between corresponding sets of pads, the solder connections resulting in a space between the pad containing surface of the chip and the pad containing surface of the substrate wherein the electrical connections are encapsulated using a specially defined thermoplastic polymer in the space around the periphery of the chip, e.g., the first rows of solder connections.

In another aspect of the invention, the thermoplastic polymer is heated and caused to flow under the chip and around the periphery of the chip and substantially all or at least some of the solder bump connections are encapsulated providing a mechanically, electrically and chemically stabilized and sealed electronic device.

In yet another aspect of the present invention a method is provided for making a reworkable encapsulated integrated circuit chip -interconnection substrate solder joined electronic component wherein the conductive pads on the circuit chip are electrically connected to corresponding pads on an interconnection substrate by solder connections between corresponding pairs of pads comprising:

a) providing an integrated circuit chip structure which comprises an integrated circuit chip electrically connected to an interconnection substrate by a plurality of solder connections between corresponding pads on the chip and corresponding pads on the substrate with there being a space between the pad containing surface of the chip and the pad containing surface of the substrate;

b) providing a thermoplastic resin; sealing the space with the thermoplastic resin by applying the resin around the edge of the chip and heating the resin to seal the space.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENTS(s)

Figure 1:
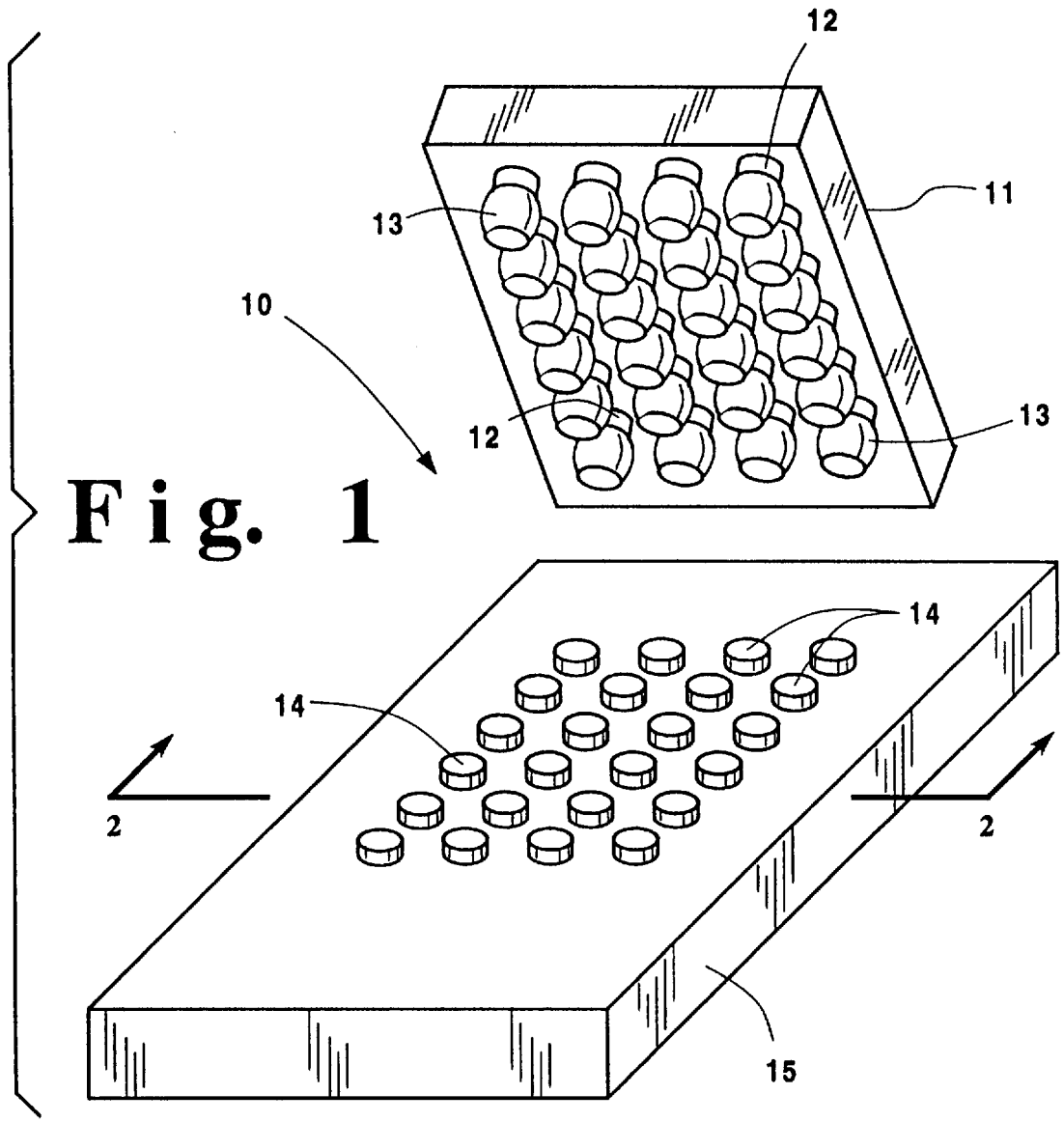
FIG. 1 is an enlarged perspective view of an electronic component comprising an integrated circuit chip containing pads and solder bumps to be electrically joined to a pad containing interconnection substrate.

In describing the preferred embodiment of the present invention, reference will be made herein to FIGS. 1–3 of the drawings in which like numerals refer to like features of the invention. Features of the invention are not necessarily shown to scale in the drawings.

Referring to FIG. 1, a typical electronic component 10 is shown comprising integrated circuit chip 11 and interconnection substrate 15. Integrated circuit chip 11 is shown having conductive pads 12 overlaid with solder bumps 13. Corresponding conductive pads 14 are shown on substrate 15. Referring to FIG. 2, electronic component 10 is depicted in cross-section wherein integrated circuit chip 11 is solder connected to interconnection substrate 15. The chip 11 is electrically connected to the substrate 15 by a plurality of solder connections 13 such as solder bumps, in a method known as C4 or flip chip packaging. The lower surface of substrate 15 may contain connectors, (not shown) for connection of the substrate 15 to another electronic device such as a circuit board.

Figure 2:
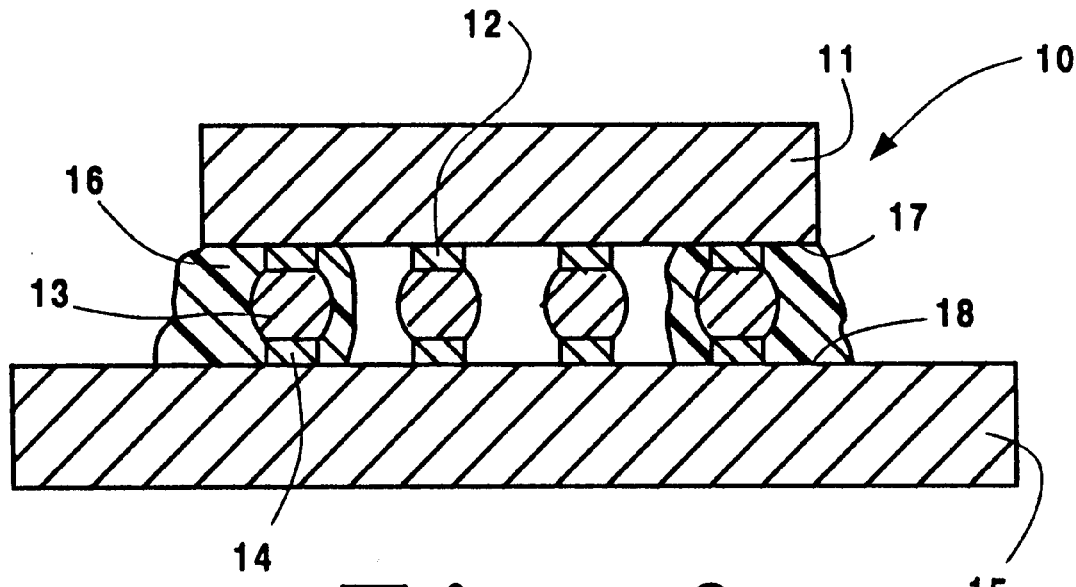
FIG. 2 is a cross-sectional view of FIG, 1 along lines 2—2 after the chip is joined to the substrate showing the chip and substrate being encapsulated at the periphery of the joined chip.
Figure 3:
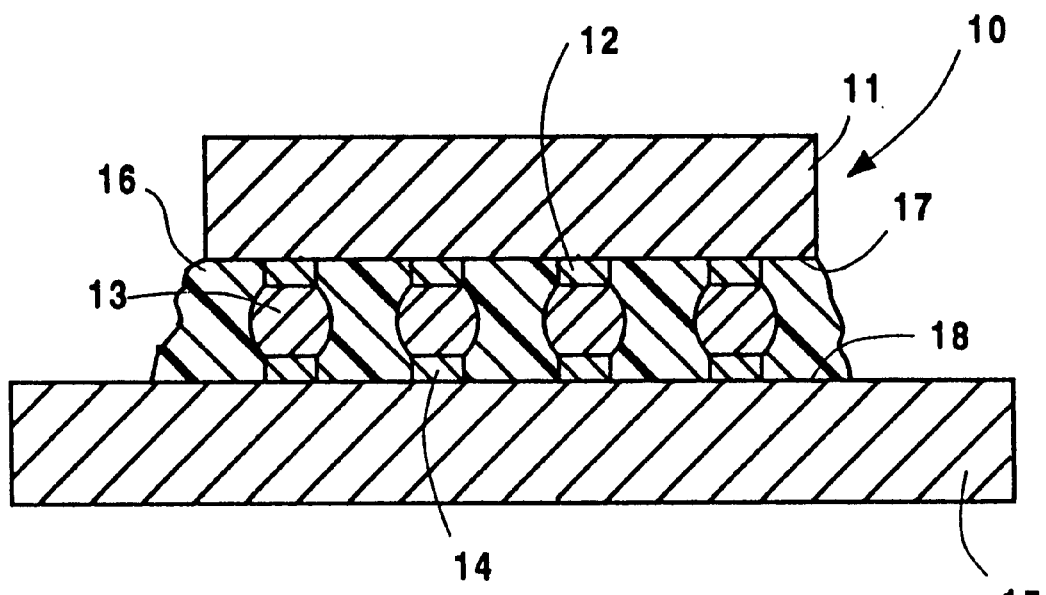
FIG. 3 is a cross-sectional view of FIG. 1 along lines 2—2 after the chip is joined to the substrate showing the chip and substrate being totally encapsulated at the periphery of the joined chip and under the joined chip.

Electronic component 10 is shown in FIG. 2 as being encapsulated by having a thermoplastic polymer sealing layer 16 between pad containing surface 17 of chip 11 and pad containing surface 18 of substrate 15. The peripheral solder bumps 13 and pads 12 and 14 are shown as encapsulated by thermoplastic polymer 16. In FIG. 3, the thermoplastic polymer sealant is shown both around the periphery of chip 11 and under the chip totally encapsulating all the solder bump 13 connections.

Integrated circuit chip 11 may be any of a number of integrated circuit devices such as a passive device or a very large scale integration (VLSI) or ultra large scale integration (ULSI) active device. Such devices are either static random access memory (SRAM) or dynamic RAM (DRAM) chips. The chips 11 as shown are generally referred to as "bare" chips. That is, they are not housed within a ceramic or polymer housing or encapsulated in such as housing Interconnection substrate 15 may be constructed of any of a number of suitable substrate materials such as ceramic or metal and is generally silicon due to its good thermal conductivity. The use of silicon also minimizes thermal mismatch when soldering the bonding pads 12 of the chip 11 to the pads 14 on the silicon substrate 15. Using similar materials for both the bare chip 11 and substrate layer 15 the possibility of thermal mismatch is less thereby preserving the integrity of the solder bump 13 which might otherwise be damaged due to thermal expansion when the electronic component is on.

Flip chip or C4 joining involves positioning the bare chip 11 with the pads 12 face down onto substrate 15, aligning the bonding pads 12 of chip 11 to corresponding conducting pads 14 on substrate 15 and thereafter joining the chip 11 and the substrate 15. This is done by heating the assembly to melt the solder bump 13 and form an electrical and mechanical connection between the chip 11 and substrate 15. This process is usually called solder reflow. Unlike conventional printed wiring boards, the pitch between bonding pads typically is between 6 and 8 mils.

Once the chip 11 has been electrically connected to substrate 15 the substrate 15 can be electrically connected to another electronic device by processes well known in the art such as card join. This is accomplished by a variety of input/output methods. Pin grid arrays, ball grid arrays, wire or cast column arrays are all connection strategies to second line packaging which may be used.

The thermoplastic resin are high temperature thermoplastic resins and may be selected from a number of resins having the properties necessary to provide the desired C4 encapsulant and mechanical, electrical and chemical reliability characteristics of the electronic components of the invention. The resins must not degrade at the C4 join temperatures which range from about 310 to 380° C. The glass transition temperature (Tg) is greater than about 120° C. and less than about 220° C., preferably less than about 200° C. and is a viscous liquid above the Tg to about 300° C. The viscosity range is preferably about 200 to 60,000 cps.

It is also important that the resins be soluble in solvents such as N-methylpyrolidone (NMP) for applying the resin to the C4 assembly for some encapsulating processes and for. reworkability of the sealed C4 assembly. Other solvents include common aldehydes, ketones, tetrahydrofuran, HFIP and gamma-butyrolactone.

Exemplary resins include polysulfone (PS), polyethersulfone (PES, polyetherimide (PEI), polyarylate (PA) and polyimide siloxane. Of these polymers polysulfone and polyetherimide are preferred because of their demonstrated effectiveness.

It has been surprisingly found that using a thermoplastic resin such as the above it is only necessary and in many applications preferable to encapsulate or fill the C4's at the periphery of the joined chip. This is an important feature of the invention because reworking of the chip is more easily performed than reworking of chips wherein more of the C4 connections are encapsulated. This also allows the use of multi chip modules which are very efficient and desirable in electronic component manufacture. For some applications, it may be desired to encapsulate some or all of the C4's and the method of the invention can be used for these purposes as well.

Fillers have been used in the prior art to reduce and/or control the coefficient of thermal expansion or control the flow of the encapsulant during drying This is important to minimize cracking or other problems caused by uneven thermal expansion of the chip, substrate, solder bump and encapsulant during use of the electronic component. Another feature of the invention is that using the thermoplastic resins of the invention a filler is not needed in the encapsulant composition. The thermoplastic polymer effectively dissipates thermal stresses because, it is hypothesized, the viscoelastic matrix of the resin distributes and in effect dissipates any stresses and minimizes any thermal cracking Filled resins may also be employed for special situations where it is desired to, for example, control the viscosity of the resin during the encapsulation process. Any of the usual fillers may be used such as silica, ceramic, glass/ceramic, barium titanate, alumina, Kevlar, boron, carbon and PBI fibers in an amount of, by weight, about 0.1 to 0.5% or more. KEVLAR and other high temperature, high modulus, low thermal coefficient of expansion particle and fiber materials and other such materials may be used for its reinforcing effect.

The encapsulation process is performed in different ways depending on the amount of C4 coverage desired. To encapsulate the peripheral C4's a bead of resin dissolved in a solvent is applied at the chip edges and heated to cause the solvent to evaporate and the resin encapsulate the outside rows of C4's. For electronic components where a higher C4 encapsulation area is desired the resin solution may be applied around the edges and melted under vacuum so that the polymer flows under the chip. A resin preform may also be applied to the chip and substrate assembly before joining and the joined assembly heated, if necessary, to melt the resin and encapsulate the C4's. The resin may also be applied as is and melted to form the seal as described above. Also material may be applied from the melt with a shear force.

EXAMPLE 1

A polyetherimide resin was dissolved in N-methylpyrolidone to form a 20% by weight solution. The solution was cast in a thin bead around the perimeter of a chip connected by C4 solder connections to a ceramic substrate. Capillary action drew the solution under the chip and around the C4 connections. The assembly was heated at 100° C. to drive off the solvent until the resin was no longer tacky. The assembly was then processed as follows:

(1) The assembly was heated slowly to 40–50° C. above the Tg of 217° C. and maintained at this temperature for 30 minutes to drive off more solvent. Although not needed, the assembly could be reflowed without any stress resulting from the resin encapsulant.

(2) The assembly was sealed as above prior to reflow and the assembly then reflowed.

In both of the above processes the chips were easily removed by heating the assembly to a temperature of about 30° C. above the Tg. The area under the chip was easily cleaned with NMP at 85° C. for 30 minutes.

EXAMPLE 2

Polysulfone resin was applied as a thin bead around the perimeter of a chip connected by C4 solder connections to a ceramic substrate and heated to 300 to 325° C. to melt the polymer. A vacuum of 27–28 inches Hg was applied for 1–5 minutes and the polysulfone flowed under the chip. The assembly was stress cycle tested by thermal cycle stress and showed no failure until 1110 cycles and 824 hours. A control assembly containing no encapsulant failed after 291 cycles and 430 hours.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for making a reworkable encapsulated integrated circuit chip electronic device comprising an integrated circuit chip having pads on the circuit chip electrically connected to corresponding pads on an interconnection substrate by electronic solder connections made by a solder reflow process comprising:

providing an integrated circuit chip assembly which comprises an integrated circuit chip electrically connected to corresponding pads on a substrate by a plurality of solder connections between the chip and the substrate with there being an opening between the surface of the chip and the surface of the substrate;

providing a thermoplastic resin, the thermoplastic resin having a Tg greater than about 120° C. and which polymer does not degrade at solder reflow temperatures;

forming a bead of the resin around the periphery of the chip;

melting the thermoplastic resin and sealing the opening with the molten thermoplastic resin; and solidifying the thermoplastic resin to form the seal.

2. The method of claim 1 wherein the first rows of solder connections around the chip are encapsulated.

3. The method of claim 1 wherein substantially all of the solder connections are encapsulated.

4. The method of claim 1 wherein the thermoplastic resins are selected from the group consisting of polysulfone, polyethersulfone, polyetherimide and polyarylate.

5. The method of claim 1 wherein a vacuum is employed to facilitate flow of the molten resin around the C4 connections.

6. The method of claim 1 wherein the thermoplastic resin is a solution.

* * * * *

UNITED STATES PATENT AND TRADEMARK OFFICE
CERTIFICATE OF CORRECTION

PATENT NO. : 5,930,597
DATED : July 27, 1999
INVENTOR(S) : Anson J. Call et al.

It is certified that error appears in the above-identified patent and that said Letters Patent is hereby corrected as shown below:

In column 2, lines 25-26, delete "4,952,122" and substitute therefor -- 4,951,122 --.

In column 4, line 57, after "thermoplastic" delete "resin" and substitute therefor -- resins --.

Signed and Sealed this

Seventh Day of December, 1999

Q. TODD DICKINSON

*Attest:*

*Attesting Officer*   *Acting Commissioner of Patents and Trademarks*